(12) United States Patent
Rasmus

(10) Patent No.: US 9,800,218 B1
(45) Date of Patent: Oct. 24, 2017

(54) APPARATUS AND METHOD FOR CORRECTING BASELINE WANDER AND OFFSET INSERTION IN AC COUPLING CIRCUITS

(71) Applicant: QUALCOMM Incorporated, San Diego, CA (US)

(72) Inventor: Todd Morgan Rasmus, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/193,716

(22) Filed: Jun. 27, 2016

(51) Int. Cl.
*H03F 3/45* (2006.01)
*H03G 3/30* (2006.01)

(52) U.S. Cl.
CPC ............ *H03F 3/45183* (2013.01); *H03G 3/30* (2013.01); *H03F 2200/375* (2013.01); *H03F 2203/45042* (2013.01); *H03F 2203/45152* (2013.01); *H03F 2203/45156* (2013.01)

(58) Field of Classification Search
CPC ................................. H03F 3/45; H04L 1/0036
USPC ............................... 327/307, 308; 330/11, 69
See application file for complete search history.

(56) References Cited

U.S. PATENT DOCUMENTS

| | | | |
|---|---|---|---|
| 6,140,857 A | 10/2000 | Bazes | |
| 2003/0157914 A1* | 8/2003 | Li | H04H 40/63 |
| | | | 455/296 |
| 2008/0057900 A1 | 3/2008 | Fang et al. | |
| 2008/0063091 A1 | 3/2008 | Dong et al. | |
| 2009/0268767 A1 | 10/2009 | Nelson | |
| 2016/0013955 A1 | 1/2016 | Dong | |
| 2016/0173299 A1 | 6/2016 | Islam et al. | |
| 2017/0093525 A1* | 3/2017 | Navid | H04L 1/0036 |

OTHER PUBLICATIONS

Boser, B., "Offset Control", EECS 247 Lecture 27, A/D, DSP, University of California at Berkeley, 2002, 15 pages.*

(Continued)

*Primary Examiner* — Steven J Mottola
(74) *Attorney, Agent, or Firm* — Loza & Loza, LLP/Qualcomm

(57) ABSTRACT

The disclosure relates to an alternating current (AC) coupling circuit including first and second capacitors having first and second input terminals configured to receive an input differential signal and generate an output differential signal at first and second output terminals of the first and second capacitors. The AC coupling circuit further includes a baseline wander correction circuit configured to make the output differential signal resistant to baseline wander due to the input differential signal including one or more time intervals of unbalanced data. The baseline wander correction circuit includes a differential difference amplifier (DDA) having a first differential input configured to receive the input differential signal, a differential output configured to generate a compensation differential signal, and a second differential input configured to receive the compensation differential signal. The compensation differential signal is applied to the output terminals of the first and second capacitors via a pair of resistors, respectively.

25 Claims, 6 Drawing Sheets

(56) References Cited

OTHER PUBLICATIONS

Duque-Carrillo J.F., et al., "Fully Differential Basic Building Blocks Based on Fully Differential Difference Amplifiers With Unity-Gain Difference Feedback", IEEE Transactions on Circuits and Systems, Part 1: Regular Papers, Mar. 1, 1995, vol. 42, No. 3, XP000510191, ISSN: 1057-7122, DOI: 10.1109/81 .376865, pp. 190-192.
International Search Report and Written Opinion—PCT/US2017/037321 - ISA/EPO—Aug. 22, 2017 (162031WO).
Sackinger E., et al., "A Verstile Building Block: the CMOS Differential Difference Amplifier", IEEE Journal of Solid-State Circuits, vol. 22, No. 2, Apr. 1, 1987, XP000195792, ISSN: 0018-9200, DOI: 10.1109/JSSC.1987.1052715, pp. 287-294.

\* cited by examiner

APPARATUS AND METHOD FOR CORRECTING BASELINE WANDER AND OFFSET INSERTION IN AC COUPLING CIRCUITS

FIELD

Aspects of the present disclosure relate generally to alternating current (AC) coupling circuits, and in particular, to an apparatus and method for correcting baseline wander and global offset insertion into an output differential signal of an AC coupling circuit without affecting the baseline wander correcting operation.

BACKGROUND

A receiving device, such as an integrated circuit (IC), typically includes an alternating current (AC) coupling circuit through which an input differential data signal is received. The AC coupling circuit typically includes a pair of capacitors having respective input terminals configured to receive the input differential signal. The AC coupling circuit further includes a pair of resistors coupled in series between respective output terminals of the capacitors. An output differential signal is generated at the output terminals of the capacitors.

If the input differential signal has balanced (e.g., random) data with substantially equal number of logic ones (1s) and zeros (0s), then the output differential signal is logically (data wise) substantially the same as the input differential signal, with the exception that the AC coupling circuit, being configured as a high pass filter (HPF), removes the DC component of the input differential signal.

However, if the input differential data signal has one or more time intervals with unbalanced data (e.g., a relatively long series of logic ones (1s) or zeros (0s)), the input differential signal functions similar to a direct current (DC) signal during such one or more time intervals. As a result, the capacitors begin to charge due to the temporary DC signal. The charged capacitors produces voltage drops across them. This results in a decay of the differential amplitude of the output differential signal.

When the input differential data signal becomes balanced again, the charged capacitors induce an offset in the output differential signal. This is termed in the art as baseline wander. Accordingly, the disclosure relates to techniques for correcting or reducing baseline wander of an output differential signal for an AC coupling circuit.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first capacitor including a first input terminal and a first output terminal; a second capacitor including a second input terminal and a second output terminal; and a baseline wander correction circuit configured to: receive an input differential signal across the first and second input terminals of the first and second capacitors; and generate a compensation differential signal based on the input differential signal, wherein the compensation differential signal produces an output differential signal across the first and second output terminals of the first and second capacitors that is resistant to baseline wander due to the input differential signal including one or more time intervals of unbalanced data.

Another aspect of the disclosure relates to a method including receiving an input differential signal across first and second input terminals of first and second capacitors; and generating a compensation differential signal based on the input differential signal, wherein the compensation differential signal produces an output differential signal across first and second output terminals of the first and second capacitors that is resistant to baseline wander due to the input differential signal including one or more time intervals of unbalanced data.

Another aspect of the disclosure relates to apparatus including means for receiving an input differential signal across first and second input terminals of first and second capacitors; and means for generating a compensation differential signal based on the input differential signal, wherein the compensation differential signal produces an output differential signal across first and second output terminals of the first and second capacitors that is resistant to baseline wander due to the input differential signal including one or more time intervals of unbalanced data.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In some data transmission systems, a transmitting device transmits a differential data signal to a receiving device via a transmission medium (e.g., one or more metal traces on a printed circuit board (PCB)). In such systems, it is often desirable to prevent the direct current (DC) level of the transmitted differential data signal from adversely affecting an analog front-end (receiver) of a receiving device. Accordingly, alternating current (AC) coupling circuits are often provided in the analog front-end to receive the differential data signal while substantially blocking the DC component of the signal.

Figure 1:
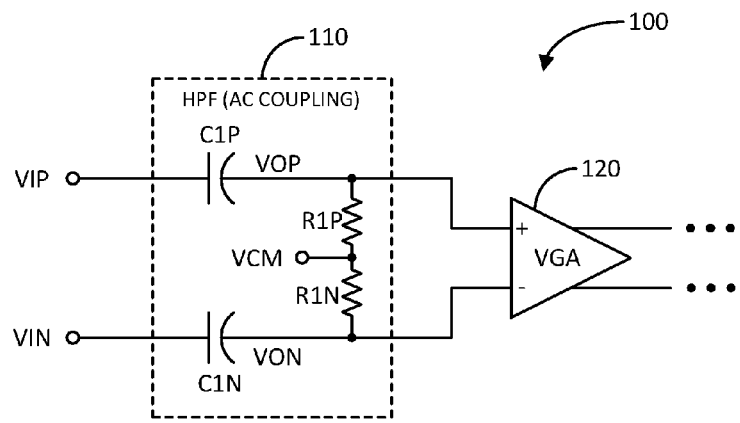
FIG. 1 illustrates a schematic diagram of at least a portion of an exemplary receiver in accordance with an aspect of the disclosure.

FIG. 1 illustrates a schematic diagram of at least a portion of an exemplary receiver 100 in accordance with an aspect of the disclosure. The receiver 100 includes an AC coupling circuit 110 and a variable gain amplifier (VGA) 120.

The AC coupling circuit 110 is configured as a high pass filter (HPF) including a pair of series capacitors C1P and C1N and a pair of shunt resistors R1P and R1N. The capacitors C1P and C1N include input terminals configured to receive positive and negative components VIP and VIN of an input differential digital signal received from a transmitting device via a channel, respectively. The capacitors C1P and C1N include output terminals coupled to positive and negative inputs of the VGA 120. The resistors R1P and R1N are coupled in series between the output terminals of the capacitors C1P and C1N. A desired common mode voltage VCM, suitable for the VGA 120, is applied to a node between the resistors R1P and R1N.

As illustrated, the AC coupling circuit 110 allows the AC component of the received differential signal VIP-VIN to pass through to the VGA 120, while substantially blocking the DC component of the signal from passing through to the VGA 120. As discussed above, this prevents the DC component of the received differential signal VIP-VIN from adversely affecting the operation of the receiver 100. This also allows a desired common mode voltage VCM for the VGA 120 to be set.

Generally, it is desirable to configure the AC coupling circuit 110 to have a low 3 dB cutoff frequency Fc. This is to prevent an adverse condition known as baseline wander, as discussed below in more detail. The cutoff frequency Fc is generally given by the following equation: $Fc=1/(2\pi*R1*C1)$, where R1 is the resistance of each of the resistors R1P and R1N (the resistances being substantially the same for both) and C1 is the capacitance of each of the capacitors C1P and C1N (the capacitances being substantially the same for both). Based on this equation, to achieve a low 3 dB cutoff frequency Fc, the resistors R1P and R1N and/or the capacitors C1P and C1N need to be made relatively large to achieve a large resistance R1 and a large capacitance C1.

If it is further desired to implement the AC coupling circuit 110 in an integrated circuit (IC), such large capacitors C1P and C1N and/or resistors R1P and R1N would occupy a substantial amount of IC area. Additionally, such large capacitors would also typically require multiple layers of the IC to achieve the desired large capacitance. This would have the further negative consequence of restricting other metal pathways useful for other IC operations.

Baseline wander is a condition that adversely affects the differential signal at the output of the AC coupling circuit 110 as a result of unbalanced data in the input differential signal VIP and VIN. An unbalanced-data differential signal VIP and VIN has significantly more logic zeros (0s) than ones (1s) or vice-versa over a certain time interval. Often an unbalanced-data differential signal has a relatively long series of consecutive ones (1s) or zeros (0s). This is explained in more detail with reference to the following mentioned figures.

Figure 2A:
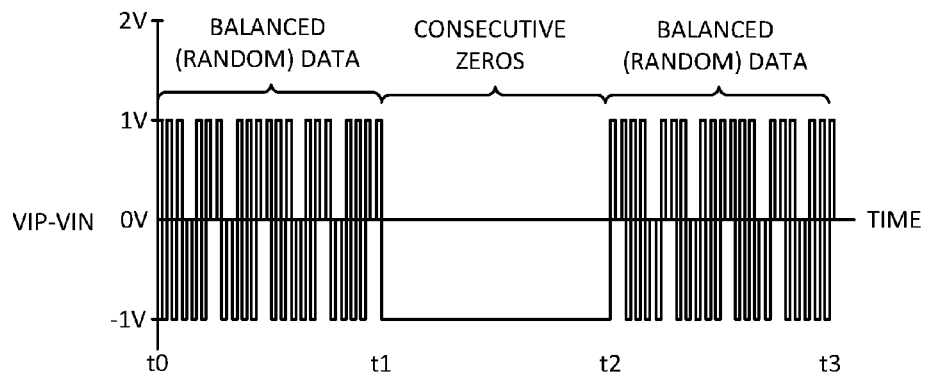
FIG. 2A illustrates a graph of an exemplary input differential signal VIP-VIN in accordance with another aspect of the disclosure.

FIG. 2A illustrates a graph of an exemplary input differential signal VIP-VIN applied to the differential input of the AC coupling circuit 100 in accordance with another aspect of the disclosure. The x- or horizontal axis represents time, and the y- or vertical axis represents the differential amplitude of the input differential signal VIP-VIN. In this example, a logic one (1) is represented with a differential amplitude of +1V and a logic zero (0) is represented with a differential amplitude −1V.

As depicted in the graph, during a first time interval t1-t0, the input differential signal is characterized as having balanced (e.g., random) data with substantially the same number of logic ones (1s) and zeros (0s). During a second interval t2-t1, the input differential signal is characterized as having unbalanced data with a relatively long series of consecutive zeros (0s). During a third time interval t3-t2, the input differential signal is characterized again as having balanced (e.g., random) data with substantially the same number of logic ones (1s) and zeros (0s).

The unbalanced portion of the input differential signal with consecutive zeros (0s) effectively functions similar to a temporary DC voltage level. As such, the DC voltage produces currents that charge the capacitors C1P and C1N. The charging current through capacitor C1P flows from the output terminal to the input terminal. The charging current through capacitor C1N flows from the input terminal to the output terminal. As a result, voltage drops begin generate across the capacitors C1P and C1N.

For instance, in this example, the consecutive zeros (0s) produce a differential amplitude of −1V. Accordingly, the voltages VIP and VIN at the input terminals of the capacitors C1P and C1N may be at −0.5V and +0.5V, respectively. Because of the voltage drops, the output terminals of the capacitors C1P and C1N may increase and decrease from −0.5V and +0.5V towards both being 0V, respectively. Thus, the differential signal VOP-VON at the output terminals of the capacitors C1P and C1N is decreasing during an unbalanced data interval. Or said differently, the eye of the differential signal VOP-VON at the output terminals of the capacitors C1P and C1N is closing. This is illustrated in the following mentioned figure.

Figure 2B:
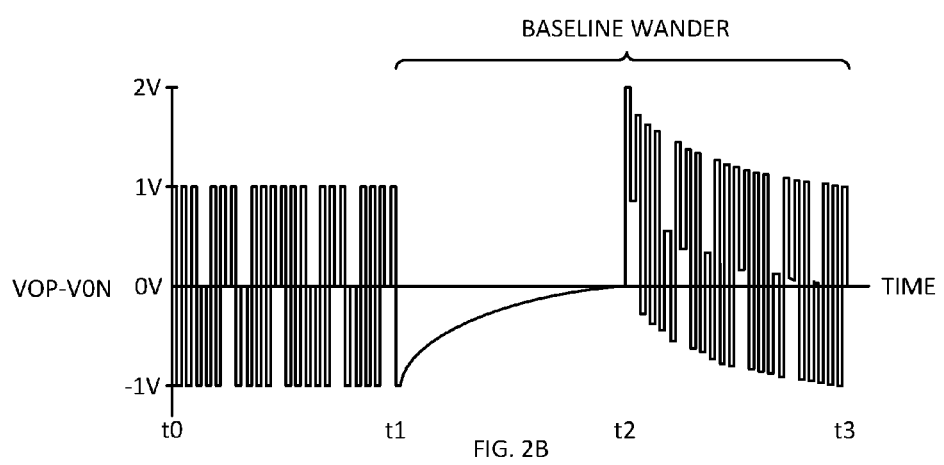
FIG. 2B illustrates a graph of an exemplary output differential signal VOP-VON in accordance with another aspect of the disclosure.

FIG. 2B illustrates a graph of an exemplary output differential signal VOP-VON of the AC coupling circuit 100 in accordance with another aspect of the disclosure. The output differential signal VOP-VON may be a result of the input differential signal depicted in FIG. 2A.

As illustrated, during the first time interval t1-t0, the output differential signal is also characterized as having balanced (e.g., random) data with substantially the same number of ones (1s) and zeros (0s) in response to the corresponding portion of the input differential signal. As a result, the VGA 120 is able to produce an amplified differential signal that is logically (data-wise) substantially the same as that of the input differential signal.

The second portion of the output differential signal is characterized by a decay in the differential amplitude due to the consecutive zeros (0s) of the corresponding portion of the input differential signal. As discussed above, this is due to the charging of the capacitors C1P and C1N and the resulting voltage drops across the capacitors. If the length of the consecutive zeros (0s) is sufficiently long, the decay in the differential amplitude may reach zero Volt (0V).

The third portion of the output differential signal includes balanced (e.g., random) data due to the random (balanced) data of the corresponding portion of the input differential signal. However, because the capacitors C1P and C1N are fully charged at the beginning of the third portion, the output differential signal is shifted upwards. The resulting decay and the upward shift in the output differential signal (e.g., signal region between times t1 and t3) is termed as baseline wander (e.g., the baseline of the output differential signal wandered from a balanced signal (e.g., the data eye is closing or shifted upwards)). Because of this baseline wander, many zeros (0s) in the third portion of the output differential signal will be misinterpreted as ones (1s) by the VGA 120 due to the upshifted output differential signal. This would result in substantial data errors.

Figure 2C:
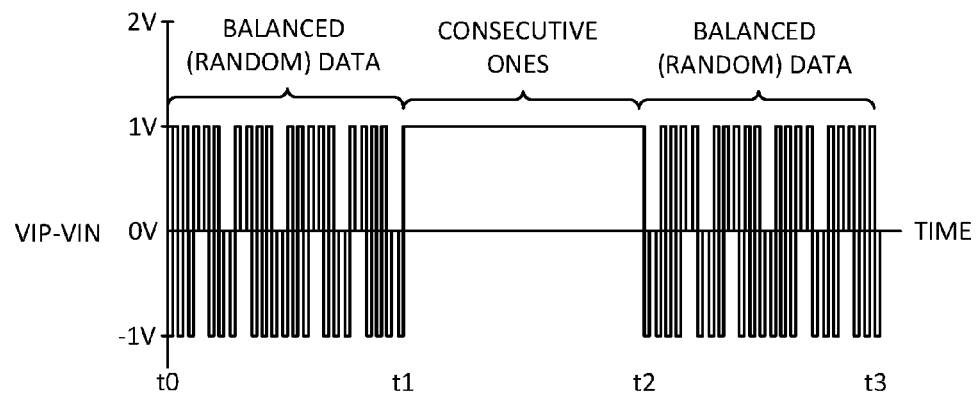
FIG. 2C illustrates a graph of another exemplary input differential signal VIP-VIN in accordance with another aspect of the disclosure.

FIG. 2C illustrates a graph of another exemplary input differential signal VIP-VIN in accordance with another aspect of the disclosure. As depicted in the graph, during a first time interval t1-t0, the input differential signal is characterized as having balanced (e.g., random) data with substantially the same number of logic ones (1s) and zeros (0s). During a second interval t2-t1, the input differential signal is characterized as having unbalanced data with a relatively long series of consecutive ones (1s). During a third time interval t3-t2, the input differential signal is characterized again as having balanced (e.g., random) data with substantially the same number of logic ones (1s) and zeros (0s).

Similarly, as discussed above, the unbalanced portion of the input differential signal with consecutive ones (1s) effectively functions similar to a temporary DC voltage level. As such, the DC voltage produces currents that charge the capacitors C1P and C1N. The charging current through capacitor C1P flows from the input terminal to the output terminal. The charging current through capacitor C1N flows from the output terminal to the input terminal. As a result, voltage drops begin to be generated across the capacitors C1P and C1N.

For instance, in this example, the consecutive ones (1s) produce a differential amplitude of 1V. Accordingly, the voltages VIP and VIN at the input terminals of the capacitors C1P and C1N may be at +0.5V and −0.5V, respectively. Because of the voltage drops, the output terminals of the capacitors C1P and C1N may decrease and increase from +0.5V and −0.5V towards both being 0V, respectively. Thus, the differential signal VOP-VON at the output terminals of the capacitors C1P and C1N is getting smaller. Or said differently, the eye of the differential signal VOP-VON at the output terminals of the capacitors C1P and C1N is closing. This is illustrated in the following mentioned figure.

Figure 2D:
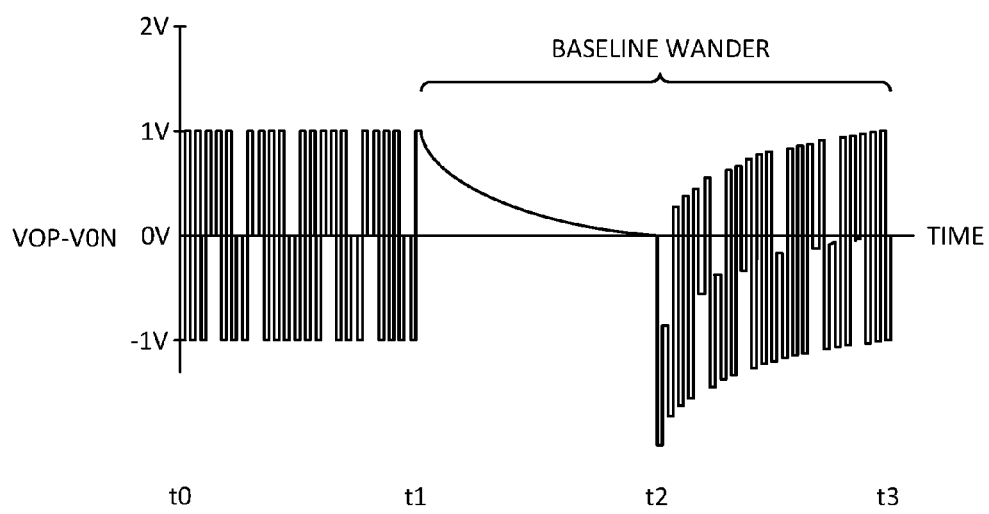
FIG. 2D illustrates a graph of another exemplary output differential signal VOP-VON in accordance with another aspect of the disclosure.

FIG. 2D illustrates a graph of the differential signal VOP-VON at the output of the AC coupling circuit 110 in response to the input differential signal VIP-VIN depicted in FIG. 2C in accordance with another aspect of the disclosure. As illustrated, during the first time interval t1-t0, the output differential signal is also characterized as having balanced (e.g., random) data with substantially the same number of ones (1s) and zeros (0s) in response to the corresponding portion of the input differential signal. As a result, the VGA 120 is able to produce an amplified differential signal that is logically substantially the same as that of the input differential signal.

The second portion of the output differential signal is characterized by a decay in the output differential amplitude due to the consecutive ones (1s) of the corresponding portion of the input differential signal. As discussed above, this is due to the charging of the capacitors C1P and C1N and the resulting voltage drops across the capacitors. If the length of the consecutive ones (1s) is sufficiently long, the differential amplitude of the output differential signal may decay to zero Volt (0V).

The third portion of the output differential signal includes balanced (e.g., random) data due to the random (balanced) data of the corresponding portion of the input differential signal. However, because the capacitors C1P and C1N are fully charged at the beginning of the third portion, the output differential signal is shifted downwards. The resulting decay and the downward shift in the output differential signal (e.g., signal region between times t1 and t3) is termed as baseline wander (e.g., the baseline of the output differential signal wandered from a balanced signal (e.g., the data eye is closing or shifted downwards)). Because of this baseline wander, many ones (1s) in the third portion of the output differential signal will be misinterpreted as zeros (0s) by the VGA 120 due to the downshifted output differential signal. This would result in substantial data errors.

By configuring the AC coupling circuit 110 with a low 3 dB cutoff frequency (with large capacitors C1P/C1N and/or resistors R1P/R1N), the decay in the differential amplitude of the output differential signal is prolonged; allowing the receiver to tolerate more consecutive zeros (0s) or ones (1) without producing data error due to baseline wander. However, as discussed above, it would be undesirable to have large capacitors and resistors especially if implemented in an IC. Thus, there is a need for a technique of correcting for baseline wander with smaller capacitors and/or resistors.

Another issue is the desired to apply a global offset to the output differential signal at the output of the AC coupling circuit 110. Such global offset may be needed to compensate for inherent offsets applied to the differential signal by the VGA 120 and one or more subsequent stages (e.g., a following continuous time linear equalizer (CTLE)) due to mismatch in transistors employed by these devices. It is further desired to provide for the insertion of the global offset without affecting the correction of baseline wander.

Accordingly, as discussed with reference to exemplary embodiments as follow, the disclosure relates to a circuit that provides for baseline wander correction including an insertion of a desired global offset to the differential signal at the output of the AC coupling circuit.

Figure 3:
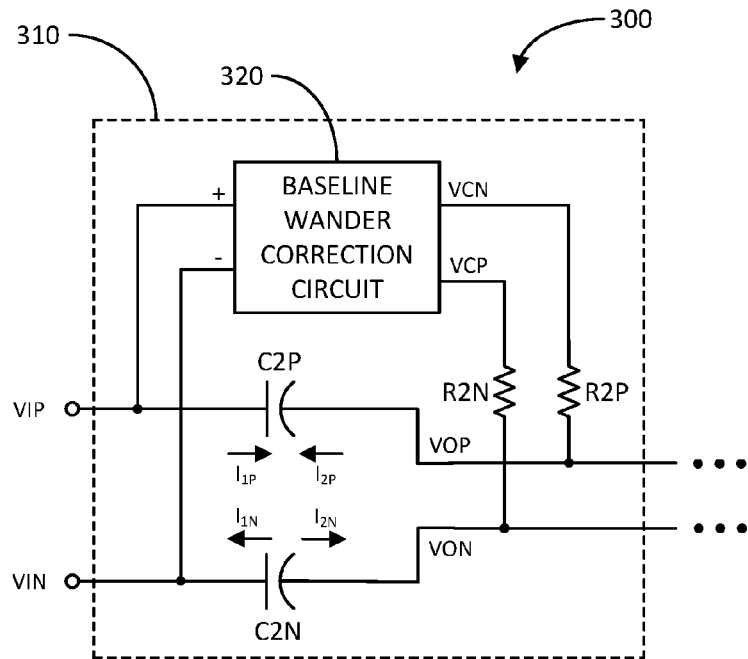
FIG. 3 illustrates a block diagram of at least a portion of another exemplary receiver in accordance with another aspect of the disclosure.

FIG. 3 illustrates a block diagram of at least a portion of another exemplary receiver 300 in accordance with another aspect of the disclosure. In summary, the receiver 300 includes an AC coupling circuit that has a baseline wander correction circuit configured to receive an input differential signal at the input side of capacitors of the AC coupling circuit, and generate a compensation differential signal to reduce baseline wander of a differential signal at the output of the AC coupling circuit.

In particular, the receiver 300 includes an AC coupling circuit 310 having capacitors C2P and C2N, and a baseline wander correction circuit 320. The capacitors C2P and C2N include input terminals configured to receive an input differential signal V1P-V1N, respectively. The baseline wander correction circuit 320 includes positive and negative inputs configured to receive the positive and negative components V1P and V1N of the input differential input.

As previously discussed, if the input differential signal includes a time interval of unbalanced data (e.g., a relatively long series of logic ones (1s) or zeros (0s)), DC currents $I_{1P}$ and $I_{1N}$ form through the capacitors C2P and C2N, respectively. In the example illustrated in FIG. 3, the currents' $I_{1P}$ and $I_{1N}$ directions are in response to an unbalanced data including a relatively long series of logic ones (1s). In such case, the current $I_{1P}$ flows from the input terminal to the output terminal of the capacitor C2P, and the current $I_{1N}$ flows from the output terminal to the input terminal of the capacitor C2N. In the case where the input differential signal includes an unbalanced data of a relatively long series of logic zeros (0s), the current $I_{1P}$ flows from the output terminal to the input terminal of the capacitor C2P, and the current $I_{1N}$ flows from the input terminal to the output terminal of the capacitor C2N.

The baseline wander correction circuit 320 is configured generate a compensation differential signal VCP and VCN based on the input differential signal VIP-VIN. The compensation differential signal VCP and VCN is coupled to the output terminals of capacitors C2P and C2N via resistors R2P and R2N, respectively. The compensation differential signal VCP and VCN is configured to produce currents $I_{2P}$ and $I_{2N}$ to counter the currents $I_{1P}$ and $I_{1N}$ resulting from unbalanced data intervals in the input differential signal VIP and VIN, respectively.

Thus, as illustrated in FIG. 3, a negative component VCN of the compensation differential signal generated by the baseline wander correction circuit 320 causes a positive component VOP of an output differential signal that produces a current $I_{2P}$ that counters current $I_{1P}$ to prevent or reduce a charging of capacitor C2P as a result of unbalanced data in the input differential signal. Similarly, a positive component VCP of the compensation differential signal generated by the baseline wander correction circuit 320 causes a negative component VON of the output differential signal that produces current $I_{2N}$ that counters current $I_{1N}$ to prevent or reduce a charging of capacitor C2N as a result of unbalanced data in the input differential signal. As a consequence, there is a substantial reduction in baseline wander of the output differential signal VOP and VON.

Since the baseline wander correction circuit 320 produces a compensation differential signal VCN and VCP that reduces baseline wander of the output differential signal VOP and VON, there is no longer a need to make the capacitors C2P and C2N and resistors R2N and R2P large in order to achieve a low 3 db cutoff frequency to reduce baseline wander of the output differential signal VOP and VON. Accordingly, the capacitors C2P and C2N and resistors R2P and R2N may be made smaller, which consume less area and layers of an IC.

Figure 4:
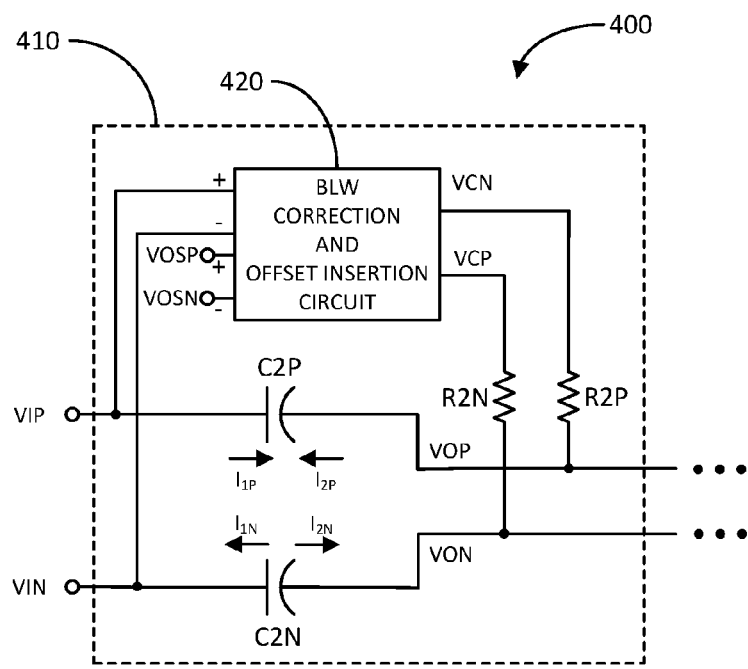
FIG. 4 illustrates a block diagram of at least a portion of another exemplary receiver in accordance with another aspect of the disclosure.

FIG. 4 illustrates a block diagram of at least a portion of an exemplary receiver 400 in accordance with another aspect of the disclosure. In summary, the receiver 400 includes an AC coupling circuit that has a baseline wander correction circuit configured to receive an input differential signal at the input terminals of capacitors of the AC coupling circuit, and generate a compensation differential signal to prevent or reduce baseline wander of an output differential signal at the output terminals of the capacitors of the AC coupling circuit. Additionally, the baseline wander correction circuit is configured to receive a desired differential offset signal in order to apply a desired offset to the output differential signal.

Similar to receiver 300, the receiver 400 includes an AC coupling circuit 410 having capacitors C2P and C2N. The receiver 400 differs from receiver 300 in that receiver 400 includes a baseline wander correction and offset insertion circuit 420. The capacitors C2P and C2N include input terminals configured to receive an input differential signal V1P and V1N, respectively. The baseline wander correction and offset insertion circuit 420 includes a first differential (positive and negative) input configured to receive the positive and negative components V1P and V1N of the input differential input VIP and VIN, respectively. The baseline wander correction and offset insertion circuit 420 includes a second differential (positive and negative) input configured to receive a desired differential offset signal VOSP and VOSN to be applied at an output differential signal at the output terminals of the capacitors C2P and C2N, respectively. The baseline wander correction and offset insertion circuit 420 includes a differential output coupled to the positive and negative output terminals of the capacitors C2P and C2N via resistors R2P and R2N, respectively.

Similar to receiver 300, the baseline wander correction and offset insertion circuit 420 is configured to sense intervals of unbalanced data in the input differential signal VIP and VIN and generate a compensation differential signal VCN and VCP to cause the output differential signal VOP and VON to produce currents $I_{2P}$ and $I_{2N}$ to counter the currents $I_{1P}$ and $I_{1N}$ resulting from the unbalanced data intervals, respectively. In addition, the baseline wander correction and offset insertion circuit 420 is configured to impress a differential offset at the compensation differential signal VCN and VCP in accordance with the input differential offset signal VOSP and VOSN, respectively. The differential offset is transferred to the output differential signal VOP and VON via the resistors R2P and R2N, respectively. The inserted offset VOSP and VOSN may be used to counter any inherent offset produced by one or more components (e.g., VGA, continuous time linear equalizer (CTLE), etc.) downstream of the AC coupling circuit 410.

Figure 5:
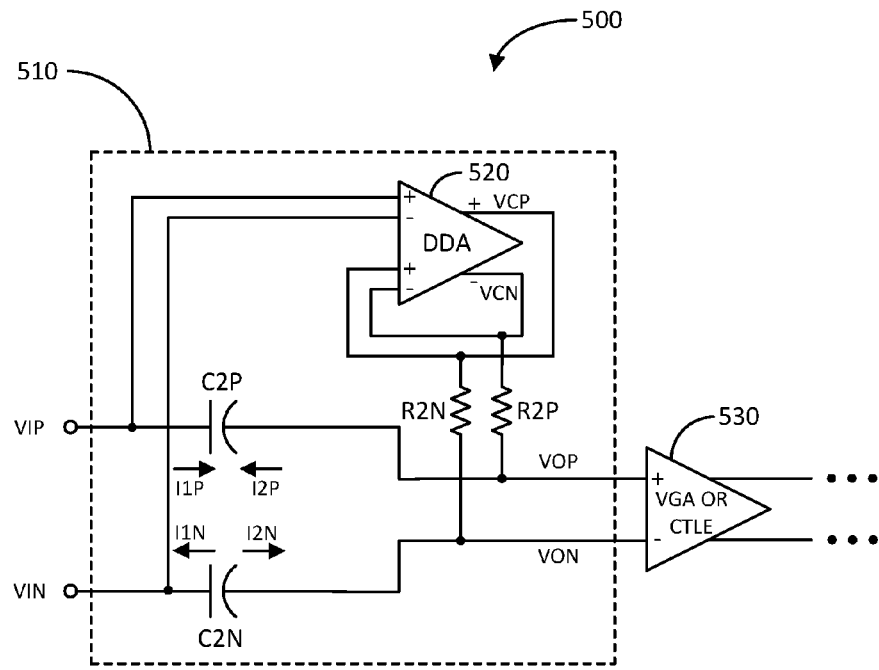
FIG. 5 illustrates a schematic diagram of at least a portion of another exemplary receiver in accordance with another aspect of the disclosure.

FIG. 5 illustrates a schematic diagram of at least a portion of an exemplary receiver 500 in accordance with another aspect of the disclosure. The receiver 500 may be an exemplary more detailed implementation of the receiver 300 previously discussed. In particular, the receiver 500 includes an AC coupling circuit 510 and a variable gain amplifier (VGA) 530. It shall be understood that the VGA 530 may be another device, such as a CTLE. Or, the CTLE may be coupled to the output of the VGA 530.

The AC coupling circuit 510 includes capacitors C2P and C2N, resistors R2P and R2N, and a differential difference amplifier (DDA) 520. An input differential signal including positive and negative components V1P and V1N are applied to input terminals of capacitors C2P and C2N, respectively. The positive and negative components VIP and VIN of the input differential signal are also applied to positive and negative components of a first differential input of the DDA 520, respectively. The output terminals of the capacitors C2P and C2N are coupled to positive and negative inputs of the VGA or CTLE 530, respectively.

The DDA 520 is configured as a unity gain amplifier. That is, the DDA 520 includes a differential (positive and negative) output coupled to a second differential (positive and negative) input of the DDA 520, respectively. The differential (positive and negative) output of the DDA 520 is also coupled to the differential (negative and positive) inputs of the VGA or CTLE 530 via resistors R2N and R2P, respectively.

As a unity gain amplifier, the DDA 520 is configured to generate a compensation differential signal VCP and VCN, which is feedback to the second input differential (positive and negative components) of the DDA. The DDA 520 is configured to generate the compensation differential signal VCP and VCN to cause a difference between the positive and negative components of the compensation differential signal VCP and VCN to be substantially the same as the difference between the positive and negative components of the input differential signal V1P and V1N applied to the differential (positive and negative) input of the DDA 520, respectively.

The baseline wander correction operates as follows: If the input differential signal V1P and V1N has an unbalanced number of logic ones and zeros (e.g., a series of consecutive ones (1s) as discussed above), the resulting DC component of the input differential signal produces charging currents $I_{1P}$ and $I_{1N}$ through the capacitors C2P and C2N, respectively.

For example, in the case of a series of consecutive ones (1s), the charging currents $I_{1P}$ and $I_{1N}$ respectively flow from input-to-output and output-to-input terminals of the capacitors C2P and C2N because the voltage VIP is, for example, +0.5V and the voltage VIN is at −0.5V. As previously discussed, this causes the differential voltage VOP and VON to reduce because some of the voltage drops between VIP and VIN are across the capacitors C2P and C2N. For a series of consecutive zeros (0s), the charging currents $I_{1P}$ and $I_{1N}$ flow in opposite directions.

The DDA 520 senses the reduction in the difference in the differential voltages VOP and VON at the second differential input via the resistors R2P and R2N, respectively. In response, the DDA 520 adjusts the compensation differential voltages VCP and VCN to generate currents $I_{2P}$ and $I_{2N}$ to counter or oppose the currents $I_{P1}$ and $I_{1N}$, respectively. Because of the countering currents $I_{2P}$ and $I_{2N}$, the capacitors C2P and C2N remain substantially uncharged. This prevents the formation of voltage drops across the capacitors C2P and C2N, which, consequently, prevents baseline wander of the output differential signal VOP-VON.

Figure 6:
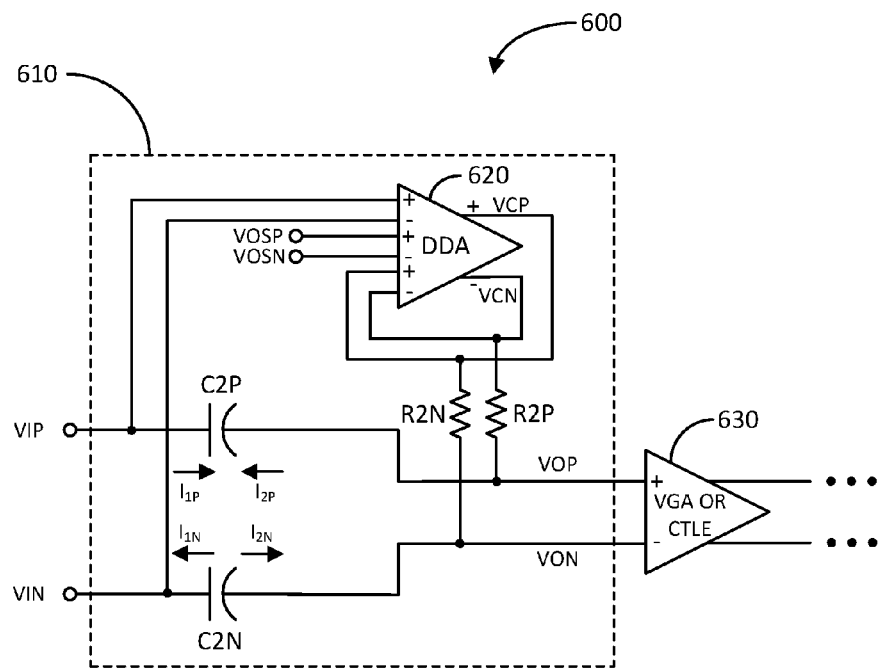
FIG. 6 illustrates a schematic diagram of at least a portion of another exemplary receiver in accordance with another aspect of the disclosure.

FIG. 6 illustrates a schematic diagram of at least a portion of another exemplary receiver 600 in accordance with another aspect of the disclosure. The receiver 600 may be an exemplary more detailed implementation of the receiver 400 previously discussed. In particular, the receiver 600 includes an AC coupling circuit 610 and a variable gain amplifier (VGA) 630. As in the previous embodiment, the VGA 630 may be another device, such as a continuous time linear equalizer (CTLE). Or, the CTLE may be coupled to the output of the VGA 630.

The AC coupling circuit 610 includes capacitors C2P and C2N, resistors R2P and R2N, and a three-differential input differential difference amplifier (DDA) 620. Similar to receiver 500, an input differential signal including positive and negative components V1P and V1N are applied to input terminals of capacitors C2P and C2N, respectively. The positive and negative components VIP and VIN of the input differential signal are also applied to a first differential (positive and negative) input of the DDA 620, respectively. The output terminals of the capacitors C2P and C2N are coupled to positive and negative inputs of the VGA or CTLE 630, respectively.

The DDA 620 is configured as a unity gain amplifier. That is, the DDA 620 includes a differential (positive and negative) output coupled to a second differential (positive and negative) input of the DDA 620, respectively. The differential (positive and negative) output of the DDA 620 is also coupled to the differential (negative and positive) inputs of the VGA or CTLE 630 via resistors R2N and R2P, respectively. The baseline wander correction of the DDA 620 operates in substantially the same manner as that of DDA 520.

With regard to offset insertion, the DDA 620 includes a third differential (positive and negative) input to receive a global differential offset VOSP and VOSN for impressing a desired global offset to the output differential signal VOP and VON at the inputs of the VGA or CTLE 630. As the global offset is an effective DC level (e.g., a generally fixed offset), the DDA 620 impresses the global offset VOSP-VOSN onto the compensation differential output signal VCP and VCN. Via the resistors R2P and R2N, the global offset is impressed onto the differential signal VOP and VON at the inputs of the VGA or CTLE 630.

As the global offset VOSP-VOSN is applied at the inputs of the DDA 620, it does not affect the baseline wander correction performed by the DDA. This is because the DDA 620 reconfigures itself to achieve the steady-state (DC level) global offset for the compensation differential signal VCP and VCN. Thus, the AC coupling circuit 610 provides for baseline wander correction, while allowing the insertion of a desired global offset to the output differential signal VOP and VON at the inputs of the VGA or CTLE 630. The DDA 620 is modified from standard DDAs in that it includes a third differential (positive and negative) input configured to receive a global offset signal VOSP and VOSN, respectively.

Figure 7:
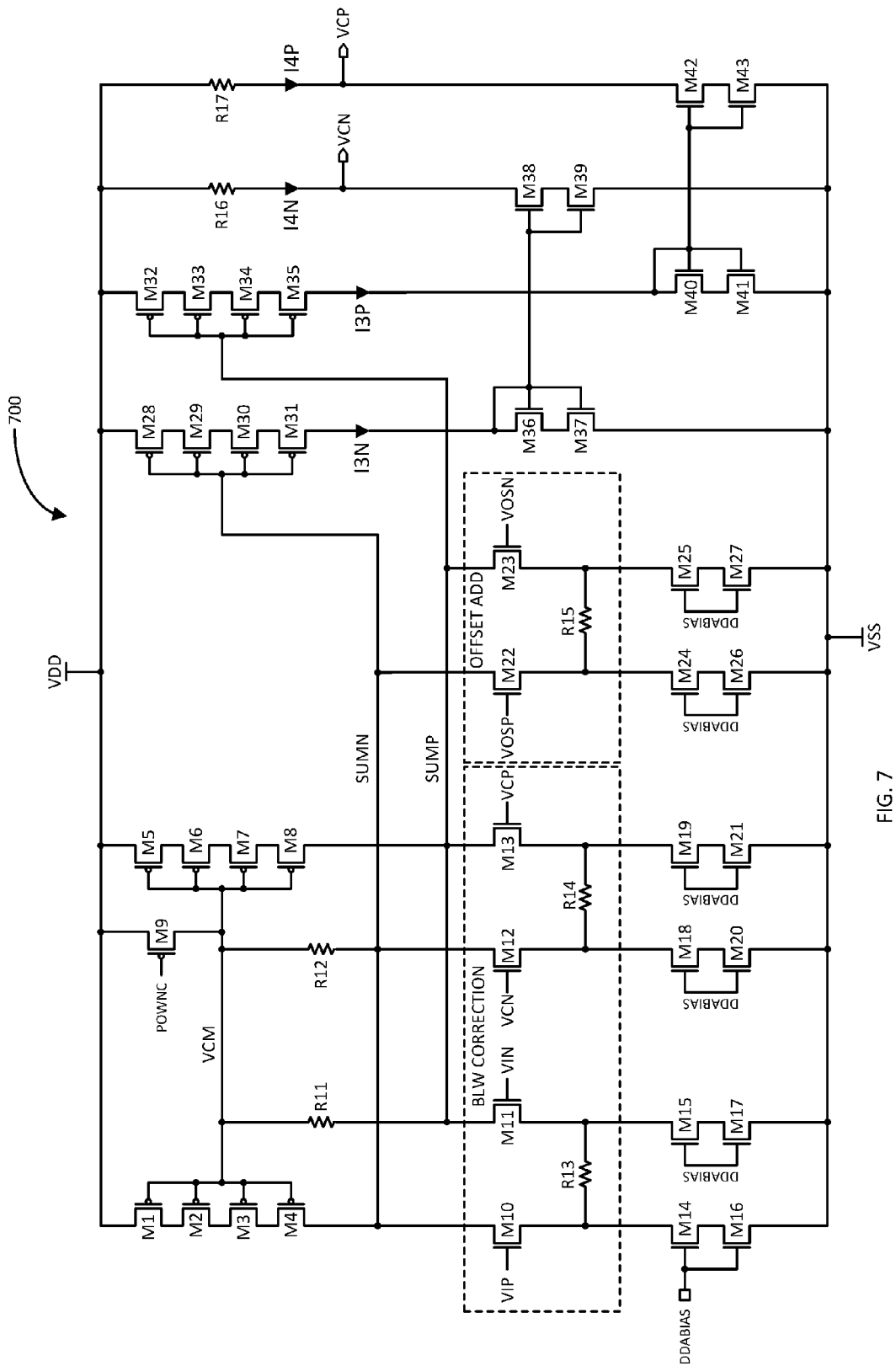
FIG. 7 illustrates a schematic diagram of an exemplary differential difference amplifier (DDA) in accordance with another aspect of the disclosure.

FIG. 7 illustrates a schematic diagram of an exemplary DDA 700 in accordance with another aspect of the disclosure. The DDA 700 includes a baseline wander correction section having a first differential transistor pair M10-M11 (e.g., n-channel field effect transistors (NFETs)) including control terminals (e.g., gates) configured to receive the input differential signal V1P and V1N, respectively. The baseline wander correction section further includes a second differential transistor pair M12-M13 (e.g., NFETs) including control terminals (e.g., gates) configured to receive the compensation differential signal VCN and VCP of the DDA 700, respectively. The DDA 700 includes a global offset insertion section including differential transistor pair M22-M23 (e.g., NFETs) including control terminals (e.g., gates) configured to receive a global offset differential signal VOSP and VOSN, respectively.

The differential transistors M10, M12, and M22 share a negative-side active load including p-channel FETs (PFETs) M1-M4 coupled in series between a first voltage rail VDD and the drains of the differential transistors M10, M12, and M22. The drains of transistors M10, M12, and M22 serve to produce a negative component SUMN of an internally-generated differential signal.

Similarly, the differential transistors M11, M13, and M23 share a positive-side active load including PFETs M5-M8 coupled in series between the first voltage rail VDD and the drains of the differential transistors M11, M13, and M23. The drains of transistors M11, M13, and M23 serve to produce a positive component SUMP of the internally-generated differential signal.

The gates of the active loads M1-M4 and M5-M8 are coupled together at a common gate node. A first resistor R11 is coupled between the common gate node and the drains of differential transistors M11, M13, and M23. A second resistor R12 is coupled between the common gate node and the drains of differential transistors M10, M12, and M22. The resistors R11 and R12 are configured to have substantially the same resistance to produce a common mode voltage VCM at the common gate node that is substantially the average of the positive and negative components SUMP and SUMN of the internally-generated differential signal.

The DDA 700 further includes a transistor M9 (e.g., PFET) coupled between the first voltage rail VDD and the common gate node of the active loads. The transistor M9 includes a control terminal (e.g., gate) configured to receive a power down signal POWNC. If the power down signal POWNC is at a high logic voltage level (e.g., VDD), the transistor M9 is turned off; thereby enabling the operation of the DDA 700. If the power down signal POWNC is at a low logic voltage level (e.g., VSS), the transistor M9 is turned on. This couples VDD to the common gate node and turns off all of the active load transistors M1 to M8; thereby disabling the operation of the DDA 700.

The DDA 700 further includes source degeneration resistors R13, R14, and R15 across the sources of differential transistor pairs M10-M11, M12-M13, and M22-M23, respectively. The source degeneration resistors R13, R14, and R15 improve the linear range of the differential transistor pairs M10-M11, M12-M13, and M22-M23, respectively.

The DDA 700 further includes tail current source transistor pairs M14/M16, M15/M17, M18/M20, M19/M21, M24/M26, and M25/M27 coupled in series between the sources of differential transistors M10, M11, M12, M13, M22, and M23 and a second voltage rail VSS, respectively. The current source transistor pairs M14/M16, M15/M17, M18/M20, M19/M21, M24/M26, and M25/M27 include control terminals (e.g., gates) configured to receive a bias voltage DDABIAS for setting the currents through these transistors. The cumulative current through the tail current source transistors is substantially the same as the cumulative current through the active load transistors.

The DDA 700 further includes transistors M28-M31 (e.g., PFETs) and transistors M36-M37 (e.g., NFETs) coupled in series between the first voltage rail VDD and the second voltage rail VSS. The gates of transistors M28-M31 are configured to receive the negative component SUMN of the internally-generated differential signal to produce an internal current I3N. Similarly, the DDA 700 further includes the transistors M32-M35 (e.g., PFETs) and transistors M40-M41 (e.g., NFETs) coupled in series between the first voltage rail VDD and the second voltage rail VSS. The gates of transistors M32-M35 are configured to receive the positive component SUMP of the internally-generated differential signal to produce an internal current I3P.

The DDA 700 further includes a first output resistor R16 coupled in series with a pair of transistors M38-M39 (e.g., NFETs) between the first voltage rail VDD and the second voltage rail VSS. The gates of transistors M36-M37 including the drain of transistor M36 are coupled together with the gates of transistors M38-M39 to form a current mirror configuration. The current mirror configuration forms a current I4N through resistor R16 related to the internal current I3N. The negative component VCN of the compensation differential signal of the DDA 700 is generated at a node between the resistor R16 and the transistor M38.

Similarly, the DDA 700 includes a second output resistor R17 coupled in series with a pair of transistors M42-M43 (e.g., NFETs) between the first voltage rail VDD and the second voltage rail VSS. The gates of transistors M40-M41 including the drain of transistor M40 are coupled together with the gates of transistors M42-M43 to form a current mirror configuration. The current mirror configuration forms a current I4N through resistor R16 related to the internal current I3P. The positive component VCP of the compensation differential signal of the DDA 700 is generated at a node between the resistor R17 and the transistor M42.

As discussed with reference to FIGS. 5-6, the differential pair M13 and M12 operates to generate the required opposing or nulling currents I2P and I2N to prevent or correct for baseline wander. The differential pair M22 and M23 operates to insert an offset voltage between SUMP and SUMN nodes, which is impressed at the compensation differential signal VCP and VCN, and ultimately, at the output differential signal VOP and VON at the input of the VGAs or CTLEs 530 and 630. The offset insertion does not affect the baseline wander correction as the differential pair M12 and M13 adjusts to maintain the desired offset across the SUMP and SUMN nodes.

Figure 8:
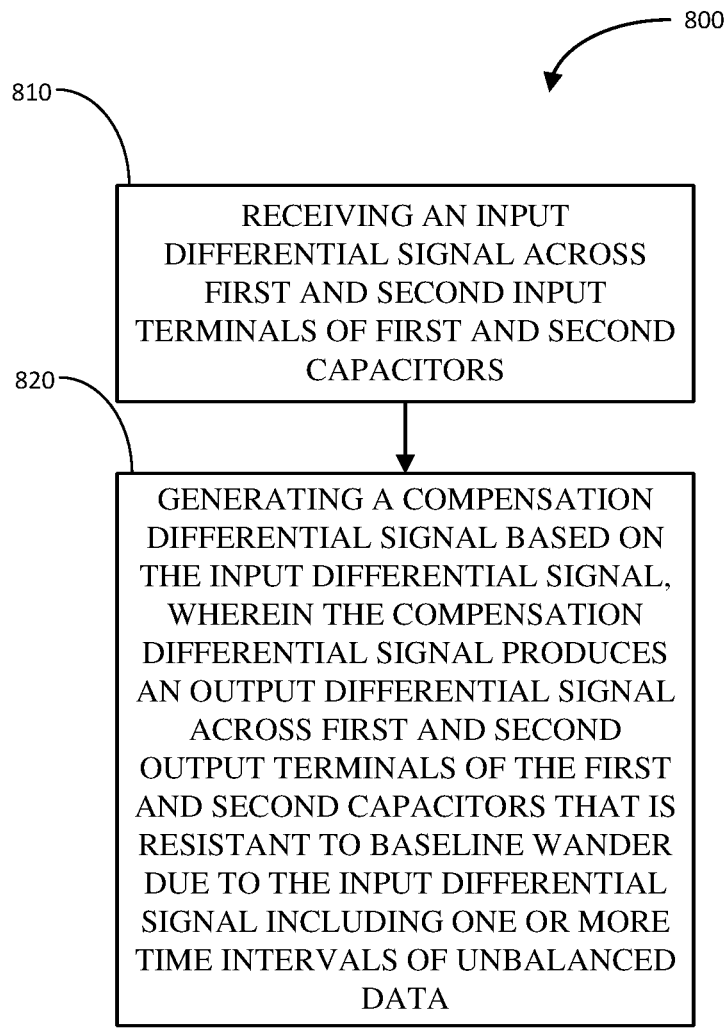
FIG. 8 illustrates a flow diagram of an exemplary method of correcting baseline wander of a differential signal in accordance with another aspect of the disclosure.

FIG. 8 illustrates a flow diagram of an exemplary method 800 of correcting baseline wander of a differential signal in accordance with another aspect of the disclosure. The method 800 includes receiving an input differential signal across first and second input terminals of first and second capacitors (block 810). Examples of means for correcting baseline wander of a differential signal in accordance with another aspect of the disclosure. The method 800 includes receiving an input differential signal across first and second input terminals of first and second capacitors include any of the differential difference amplifiers (DDAs) described herein.

The method 800 further includes generating a compensation differential signal based on the input differential signal, wherein the compensation differential signal produces an output differential signal across first and second output terminals of the first and second capacitors that is resistant to baseline wander due to the input differential signal including one or more time intervals of unbalanced data (block 820). Examples of means for generating a compensation differential signal based on the input differential signal, wherein the compensation differential signal produces an output differential signal across first and second output terminals of the first and second capacitors that is resistant to baseline wander due to the input differential signal including one or more time intervals of unbalanced data include any of the differential difference amplifiers (DDAs) described herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. An apparatus, comprising:
 a first capacitor including a first input terminal and a first output terminal;
 a second capacitor including a second input terminal and a second output terminal; and a baseline wander correction circuit configured to:
receive an input differential signal across the first and second input terminals of the first and second capacitors;
generate a compensation differential signal based on the input differential signal, wherein the compensation differential signal produces an output differential signal across the first and second output terminals of the first and second capacitors that is resistant to baseline wander due to the input differential signal including one or more time intervals of unbalanced data;
receive an input offset differential signal; and
impress an offset on the output differential signal based on the input offset differential signal.

2. The apparatus of claim 1, wherein the baseline wander correction circuit is configured to impress the offset on the output differential signal without affecting the resistance of the output differential signal to baseline wander.

3. An apparatus, comprising:
a first capacitor including a first input terminal and a first output terminal;
a second capacitor including a second input terminal and a second output terminal; and
a baseline wander correction circuit configured to:
receive an input differential signal across the first and second input terminals of the first and second capacitors; and
generate a compensation differential signal based on the input differential signal, wherein the compensation differential signal produces an output differential signal across the first and second output terminals of the first and second capacitors that is resistant to baseline wander due to the input differential signal including one or more time intervals of unbalanced data, wherein the baseline wander correction circuit comprises a difference differential amplifier (DDA).

4. The apparatus of claim 3, wherein the DDA includes a first differential input configured to receive the input differential signal.

5. The apparatus of claim 4, wherein the DDA further comprises:
a differential output configured to generate the compensation differential signal; and
a second differential input configured to receive the compensation differential signal.

6. The apparatus of claim 5, further comprising:
a first resistor coupled between a negative terminal of the differential output of the DDA and the first output terminal of the first capacitor; and
a second resistor coupled between a positive terminal of the differential output of the DDA and the second output terminal of the second capacitor.

7. The apparatus of claim 5, wherein the DDA further comprises a third differential input configured to receive an input offset differential signal, wherein the DDA is further configured to impress an offset on the output differential signal based on the input offset differential signal.

8. The apparatus of claim 1, further comprising a variable gain amplifier (VGA) including an input differential input coupled to the first and second output terminals of the first and second capacitors, respectively.

9. The apparatus of claim 1, further comprising an equalizer including an input differential input configured to receive a differential signal based on the output differential signal.

10. A method, comprising:
receiving an input differential signal across first and second input terminals of first and second capacitors;
generating a compensation differential signal based on the input differential signal, wherein the compensation differential signal produces an output differential signal across first and second output terminals of the first and second capacitors that is resistant to baseline wander due to the input differential signal including one or more time intervals of unbalanced data;
receiving an input offset differential signal; and
impressing an offset on the output differential signal based on the input offset differential signal.

11. The method of claim 10, wherein impressing the offset on the output differential signal comprise impressing the offset on the output differential signal without affecting the resistance of the output differential signal to baseline wander.

12. The method of claim 10, wherein a difference between the compensation differential signal is substantially the same as a difference between the input differential signal.

13. A method, comprising:
receiving an input differential signal across first and second input terminals of first and second capacitors;
generating a compensation differential signal based on the input differential signal, wherein the compensation differential signal produces an output differential signal across first and second output terminals of the first and second capacitors that is resistant to baseline wander due to the input differential signal including one or more time intervals of unbalanced data; and
applying the compensation differential signal to the first and second output terminals of the first and second capacitors via first and second resistors, respectively.

14. A method, comprising:
receiving an input differential signal across first and second input terminals of first and second capacitors;
generating a compensation differential signal based on the input differential signal, wherein the compensation differential signal produces an output differential signal across first and second output terminals of the first and second capacitors that is resistant to baseline wander due to the input differential signal including one or more time intervals of unbalanced data;
receiving an input offset differential signal; and
impressing an offset on the compensation differential signal based on the input offset differential signal.

15. The method of claim 10, further comprising amplifying the output differential signal.

16. The method of claim 15, further comprising equalizing the amplified output differential signal.

17. The method of claim 10, further comprising equalizing the output differential signal.

18. An apparatus, comprising:
means for receiving an input differential signal across first and second input terminals of first and second capacitors;
means for generating a compensation differential signal based on the input differential signal, wherein the compensation differential signal produces an output differential signal across first and second output terminals of the first and second capacitors that is resistant to baseline wander due to the input differential signal including one or more time intervals of unbalanced data;
means for receiving an input offset differential signal; and
means for impressing an offset on the output differential signal based on the input offset differential signal.

19. The apparatus of claim 18, wherein the means for impressing the offset on the output differential signal comprise means for impressing the offset on the output differential signal without affecting the resistance of the output differential signal to baseline wander.

20. The apparatus of claim 18, wherein a difference between the compensation differential signal is substantially the same as a difference between the input differential signal.

21. An apparatus, comprising:
   means for receiving an input differential signal across first and second input terminals of first and second capacitors;
   means for generating a compensation differential signal based on the input differential signal, wherein the compensation differential signal produces an output differential signal across first and second output terminals of the first and second capacitors that is resistant to baseline wander due to the input differential signal including one or more time intervals of unbalanced data; and
   means for applying the compensation differential signal to the first and second output terminals of the first and second capacitors via first and second resistors, respectively.

22. An apparatus, comprising:
   means for receiving an input differential signal across first and second input terminals of first and second capacitors;
   means for generating a compensation differential signal based on the input differential signal, wherein the compensation differential signal produces an output differential signal across first and second output terminals of the first and second capacitors that is resistant to baseline wander due to the input differential signal including one or more time intervals of unbalanced data;
   means for receiving an input offset differential signal; and
   means for impressing an offset on the compensation differential signal based on the input offset differential signal.

23. The apparatus of claim 18, further comprising means for amplifying the output differential signal.

24. The apparatus of claim 23, further comprising means for equalizing the amplified output differential signal.

25. The apparatus of claim 18, further comprising means for equalizing the output differential signal.

\* \* \* \* \*